(12) United States Patent
Meng et al.

(10) Patent No.: US 12,007,417 B2
(45) Date of Patent: Jun. 11, 2024

(54) VOLTAGE SENSING CIRCUIT AND METHOD

(71) Applicant: SIGNIFY HOLDING B.V., Eindhoven (NL)

(72) Inventors: Zhaomin Meng, Shanghai (CN); Hui Zhang, Shanghai (CN); Jiuliang Ding, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 115 days.

(21) Appl. No.: 17/797,341

(22) PCT Filed: Feb. 19, 2021

(86) PCT No.: PCT/EP2021/054112
§ 371 (c)(1),
(2) Date: Aug. 3, 2022

(87) PCT Pub. No.: WO2021/165447
PCT Pub. Date: Aug. 26, 2021

(65) Prior Publication Data
US 2023/0058315 A1   Feb. 23, 2023

(30) Foreign Application Priority Data

Feb. 21, 2020  (WO) ................ PCT/CN2020/076184
Apr. 9, 2020   (EP) .................................... 20169105

(51) Int. Cl.
*G01R 19/165*   (2006.01)
*G01R 15/04*    (2006.01)
(Continued)

(52) U.S. Cl.
CPC ....... *G01R 19/16576* (2013.01); *G01R 15/04* (2013.01); *G01R 31/52* (2020.01);
(Continued)

(58) Field of Classification Search
CPC .. G01R 19/16576; G01R 15/04; G01R 31/52; G01R 31/66; G01R 31/54; H05B 45/14; H05B 45/50; H05B 45/34; Y02B 20/30
(Continued)

(56) References Cited

U.S. PATENT DOCUMENTS

| | | | |
|---|---|---|---|
| 2002/0089860 A1* | 7/2002 | Kashima | ............... H02M 3/156 363/13 |
| 2012/0013345 A1* | 1/2012 | Carter | ...................... G01D 3/08 324/538 |

(Continued)

FOREIGN PATENT DOCUMENTS

| | | |
|---|---|---|
| CN | 104483536 A | 4/2015 |
| JP | 2005059623 A | 3/2005 |
| WO | 2015053206 A1 | 4/2015 |

*Primary Examiner* — Ryan Jager

(57) ABSTRACT

A voltage sensing circuit uses a voltage divider for providing a sense signal indicating the voltage across a circuit component. A current injector is used for injecting current to the sensing terminal. A sense signal is obtained with no current injection, to determine if a fault is present. The sensing terminal is coupled to the external circuit component via a voltage clamping component. A further sense signal is obtained in response to the injection of current. By comparing the sense signal in response to the injected current and a clamping voltage of the voltage clamping component, it can then be determined if the fault is caused by the circuit component or by the voltage divider.

15 Claims, 3 Drawing Sheets

(51) Int. Cl.
   *G01R 31/52*   (2020.01)
   *G01R 31/66*   (2020.01)
   *H05B 45/14*   (2020.01)
   *H05B 45/50*   (2022.01)

(52) U.S. Cl.
   CPC .............. *G01R 31/66* (2020.01); *H05B 45/14* (2020.01); *H05B 45/50* (2020.01)

(58) Field of Classification Search
   USPC ........................................................ 315/307
   See application file for complete search history.

(56) References Cited

U.S. PATENT DOCUMENTS

| | | | |
|---|---|---|---|
| 2015/0062768 A1* | 3/2015 | Prescott ................. | H02H 9/045 |
| | | | 361/86 |
| 2015/0102726 A1* | 4/2015 | Yoneoka ................ | H05B 45/14 |
| | | | 315/121 |
| 2016/0254753 A1* | 9/2016 | Malinin ............ | H02M 3/33507 |
| | | | 363/21.16 |
| 2017/0248641 A1* | 8/2017 | Shi ......................... | G01R 31/52 |

\* cited by examiner

VOLTAGE SENSING CIRCUIT AND METHOD

CROSS-REFERENCE TO PRIOR APPLICATIONS

This application is the U.S. National Phase application under 35 U.S.C. § 371 of International Application No. PCT/EP2021/054112, filed on Feb. 19, 2021, which claims the benefits of European Patent Application No. 20169105.2, filed on Apr. 9, 2020, and Chinese Patent Application No. PCT/CN2020/076184, filed on Feb. 21, 2020. These applications are hereby incorporated by reference herein.

FIELD OF THE INVENTION

This invention relates to sensing the voltage across a circuit component, for example for the purposes of generating a feedback signal for the control of the circuit component. For example, it relates to feedback control of the voltage at a LED arrangement, for controlling a voltage regulator.

BACKGROUND OF THE INVENTION

Controllable LED drivers may be used to vary the voltage and/or current supply provided to a load in the form of a LED arrangement. Control of such LED drivers is for example based on a feedback loop, which feeds back the current or voltage at the LED arrangement. This invention relates for example to LED drivers which make use of a voltage feedback signal representing the voltage across the LED arrangement.

The voltage feedback signal is for example generated by a resistor voltage divider, by measuring a voltage across a voltage sensing resistor of the voltage divider. If the voltage sensing resistor fails with an open circuit, the voltage control circuit cannot work properly due to no feedback signal from the sensing resistor. If the voltage sensing resistor fails with a closed circuit, the voltage control circuit will (continuously) try to increase the voltage in response as it receives a feedback signal indicating no voltage, and this can result in safety issues.

LED drivers must for example comply with a single fault safety requirement, meaning that the driver has still to be safe in the event that a single component fails (open circuit or short circuit). If the voltage feedback system fails, a safety issue can arise, as explained above.

The normal solution to this issue is to use a second voltage sensing resistor and associated control circuit as a backup circuit. This adds circuit complexity and adds to the power losses of the circuit.

It would also be desirable to be able identify the cause of a circuit failure.

There is therefore a need for an improved voltage sense arrangement which detects individual component failure.

US20170248641A1, though also have a current source and a voltage divider, is to detect a fault of an external device connected to data pin D-.

SUMMARY OF THE INVENTION

It is a concept of the invention to perform two voltage feedback measurements in order to identify a circuit fault and also the cause of the circuit fault. A first feedback measurement is made from a voltage divider. If a fault is detected, such as a zero detected feedback voltage, a second feedback measurement is made with an additional injection of current into the voltage divider. This second feedback measurement enables the cause of the circuit fault to be identified: which one of the external circuit component and the voltage divider is causing the fault.

The invention is defined by the claims.

According to examples in accordance with an aspect of the invention, there is provided a voltage sensing circuit for sensing a voltage across a circuit component, comprising:

a first terminal and a second terminal adapted to connect across the circuit component;

a voltage divider including first and second resistors in series, connected in parallel with the circuit component and between the first terminal (12) and the second terminal (14), wherein a sensing terminal between the first and second resistors is for providing a sense signal that is able to indicate the voltage across the circuit component;

a voltage clamping component (D1) coupled from the sensing terminal to the external circuit component;

a current injector for injecting current to the sensing terminal; and a controller for receiving the sense signal and for controlling the current injection, wherein the controller is adapted to:
  detect if the sense signal has dropped below a minimum threshold indicating a fault and in response control the current injector to inject a current into the sensing terminal; and
  detect the sense signal in response to the injection of current and in response thereto determine if the fault is caused by the circuit component or by the voltage divider by comparing the sense signal in response to the injected current and a clamping voltage of the voltage clamping component (D1).

This voltage sensing circuit detects a circuit fault based on a sense signal dropping below a threshold, for example indicating a short circuit. This short circuit may be caused by the circuit components (fully shorting the voltage divider) or by the sense resistor of the voltage divider having a short circuit failure in one resistor or an open circuit failure in the other resistor. In order to further determine which of these possible causes is responsible, a voltage clamping component is provided, and a further sense signal is obtained during injection of current into the sensing terminal and compared with the clamping voltage to determine the root cause of the fault.

More specifically, the controller is adapted to determine that the fault is caused by the external circuit component if the sense signal voltage equals to a clamping voltage of the voltage clamping component and determine that the fault the caused by the voltage divider if the sense signal is different from the clamping voltage of the voltage clamping component. For example, if the resistor of the voltage is not a short circuit, a voltage can build up across the resistor, whereas if the resistor is a short circuit, the voltage will remain at zero. If the circuit component has a short circuit, the ends of the voltage divider are shorted, hence injecting current to the sensing terminal creates a voltage equals to the clamping voltage at that terminal. As a result, possible causes of a short circuited sense signal can be discriminated.

The voltage divider generates a voltage at the sensing terminal which is representative of the output voltage across the circuit component, as well as a sense signal to be used in the fault identification.

The voltage clamping component comprises a diode forwarded from the sensing terminal to the first terminal. Thus, it is in parallel with a first resistor of the voltage divider, and the other resistor is the sensing resistor. This clamping component enables a recognizable voltage to be present at the sensing terminal in certain failure modes. Further, since the voltage clamp component is reversely biased from the first terminal, it does not affect the normal sensing of the voltage divider when every component is intact and does not cause power loss.

The controller is for example adapted to determine that the first and second terminals are short circuited due to the circuit component if the sense signal in response to the injection of current is substantially equal to a clamp voltage of the voltage clamping component. In this case, a current path involving the voltage clamping component and the short circuited circuit component has low impedance thus current would flow in this path, meanwhile a clamp voltage is generated at the sensing terminal.

The controller may be adapted, if it is determined that the first and second terminals are short circuited due to the circuit component, to generate a short circuit protection mode message or to generate a shut down message.

This message may be used by a driver to output a minimum current (using a current control loop) or else it may be used by a driver to completely shut down.

The controller may be adapted to determine that the first resistor connected to the first terminal is open if the sense signal in response to the injection of current is above an upper threshold. This is because the injected current causes a voltage drop across the second resistor which exceeds a normal operating voltage. In this case, the circuit component that is not short circuit plus the voltage clamping component, as well as the second resistor, is still relative high impedance, thus a high voltage will present at the sensing terminal.

The controller may be adapted to determine that the second resistor connected to the second terminal is short circuited if the sense signal in response to the injection of current is below a lower threshold. This second resistor is the sense resistor, so it if it short circuited, the voltage will be zero. Otherwise the voltage will still be the clamping voltage and the fault is short circuit of the circuit component.

The controller may be adapted, if it is determined that the first resistor is open or the second resistor is short circuited, to generate a shut down message.

The voltage sensing circuit may further comprise a voltage detector adapted to determine sense signal voltages at the sensing terminal, wherein the voltage detector, the current injector and the controller together form part of an integrated circuit.

The integrated circuit performs the signal analysis from the resistor divider.

The invention also provides a lighting device comprising:
the voltage sensing circuit as defined above; and
a LED arrangement which comprises the circuit component.

A voltage regulator may then be provided for controlling the voltage applied to the LED arrangement.

The voltage sensing circuit is for example adapted, if it is determined that the first and second terminals are short circuited due to the circuit component, to send:
a short circuit protection mode message to the voltage regulator to control the voltage regulator to allow output of a minimum current; or
a shut down message to the voltage regulator to control the voltage regulator to completely shut down and output substantially no current.

The invention also provides an integrated circuit comprising a voltage sensing function to sense a voltage across an external circuit component, comprising:
a sensing input to be connected to a sensing terminal of a voltage divider which is connected in parallel with the external circuit component, wherein said sensing terminal is coupled to the external circuit component via a voltage clamping component;
a voltage detector adapted to determine a sense signal voltage at the sensing input;
a current injector to inject current to the sensing terminal if the sense signal voltage is below a minimum threshold, thereby indicating a fault, wherein the voltage detector is then adapted to determine a sense signal voltage at the sensing input in response to the injected current from the current source; and
a controller to determine if the fault is caused by the voltage divider or by an external circuit component connected in parallel with the voltage divider, based on the sense signal voltage in response to the injection of current by comparing the sense signal in response to the injected current and a clamping voltage of the voltage clamping component.

This provides the integrated circuit used for processing the voltage received from the voltage divider.

The invention also provides a voltage sensing method for sensing a voltage relating to a circuit component between a first terminal and a second terminal, the method comprising:
receiving a first sense signal from a sensing terminal between first and second resistors in series of a voltage divider, the first sense signal indicating a voltage across a circuit component being sensed, wherein there is a voltage clamping component coupled from the sensing terminal to the circuit component;
detecting if the first sense signal has dropped below a minimum threshold and in response controlling a current injector to inject a current into the sensing terminal;
detecting a second sense signal in response to the injection of current; and
determining if the fault is caused by the circuit component or by the voltage divider based on the second sense signal, by comparing the second sense signal in response to the injected current and a clamping voltage of the voltage clamping component.

A voltage clamping component is for example between the sensing terminal and the first terminal, and wherein the method comprises:
determining that the first and second terminals are short circuited due to the circuit component if the second sense signal is substantially equal to a clamp voltage of the voltage clamping component; and/or
determining that the first resistor connected to the first terminal is open if the second sense signal is above a higher threshold; and/or
determining that the second resistor connected to the second terminal is short circuited if the second sense signal is below a lower threshold.

These and other aspects of the invention will be apparent from and elucidated with reference to the embodiment(s) described hereinafter.

BRIEF DESCRIPTION OF THE DRAWINGS

Examples of the invention will now be described in detail with reference to the accompanying drawings, in which.

DETAILED DESCRIPTION OF THE EMBODIMENTS

Figure 1:
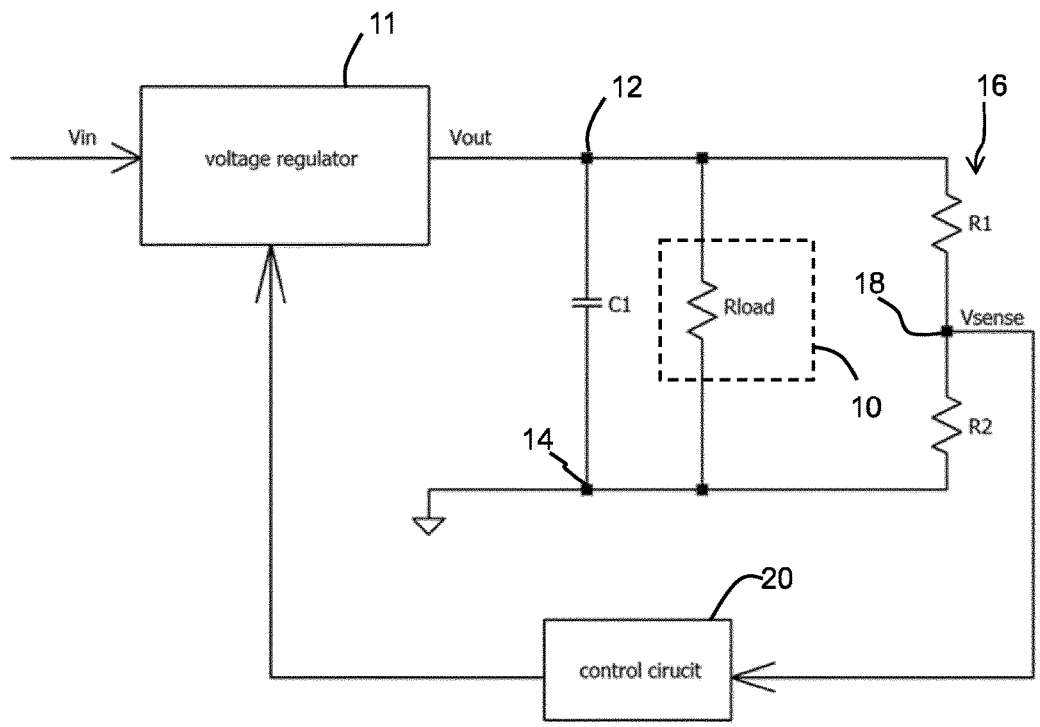
FIG. 1 shows a known electronic appliance comprising a circuit component and a voltage sensing circuit for feedback control purposes.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a voltage sensing circuit which uses a voltage divider for providing a sense signal indicating the voltage across a circuit component. A current injector is used for injecting current to the sensing terminal. A sense signal is obtained with no current injection, to determine if a fault is present. A further sense signal is obtained in response to the injection of current. It can then be determined if the fault is caused by the circuit component or by the voltage divider.

The invention may be applied to the control of any component based on feedback of a voltage indicative of the voltage across the component.

FIG. 1 shows a known electronic appliance comprising a circuit component 10 represented schematically as a load resistor Rload. A smoothing capacitor C1 is in parallel with the load.

A driver 11 in the form of a voltage regulator delivers a regulated output voltage Vout between a first terminal 12 and a second terminal 14. The circuit component 10 is connected between the first and second terminals 12, 14.

The driver does not directly generate a fixed voltage. Instead, the driver delivers current to the load. The current results in a voltage Vout across the load which is measured and provided as a feedback signal. The feedback signal is used to control operating parameters of the voltage regulator (such as frequency or duty cycle) to adapt the current, and thereby regulate the voltage to the desired level. In short, the current source also has a voltage regulation function to avoid over voltage (due to open circuit) or under voltage (due to short circuit) etc.

Although schematically represented as a resistor, the circuit component may take any form. In one example of particular interest, the circuit component is a LED arrangement and the driver 11 is a voltage controlled LED driver.

A voltage divider 16 includes first and second resistors R1, R2 in series. A sensing terminal 18 is defined between the first and second resistors and provides a sense signal Vsense indicating the voltage across the circuit component, in normal operation. In particular, the sense signal is a voltage across the second resistor R2, and it is a fixed fraction of the output voltage Vout. The first resistor R1 connects between the first terminal and the sensing terminal and the second resistor R2 connects between the second terminal and the sensing terminal.

The sense signal Vsense is provided to a controller 20, which generates a drive signal for controlling the driver 11, thereby to regulate the output voltage in dependence on the sense signal.

The feedback system will fail if any of the individual circuit components fails. The circuit component 10 may become open circuit or short circuit, and each resistor R1, R2 of the voltage divider may become open circuit of short circuit. The below embodiment mainly concerns that the circuit component becomes short circuited, R1 become open circuit, and R2 become short circuited. For a case that the circuit component become open, the sense signal will become very high if the driver is a current source so this fault can be identified. If the R2 is open circuit or R1 is short circuit, the sense signal becomes equal to the total output voltage of the driver, so this fault can also be identified.

The circuit of FIG. 1 is not able to distinguish between these different circuit failures.

Figure 2:
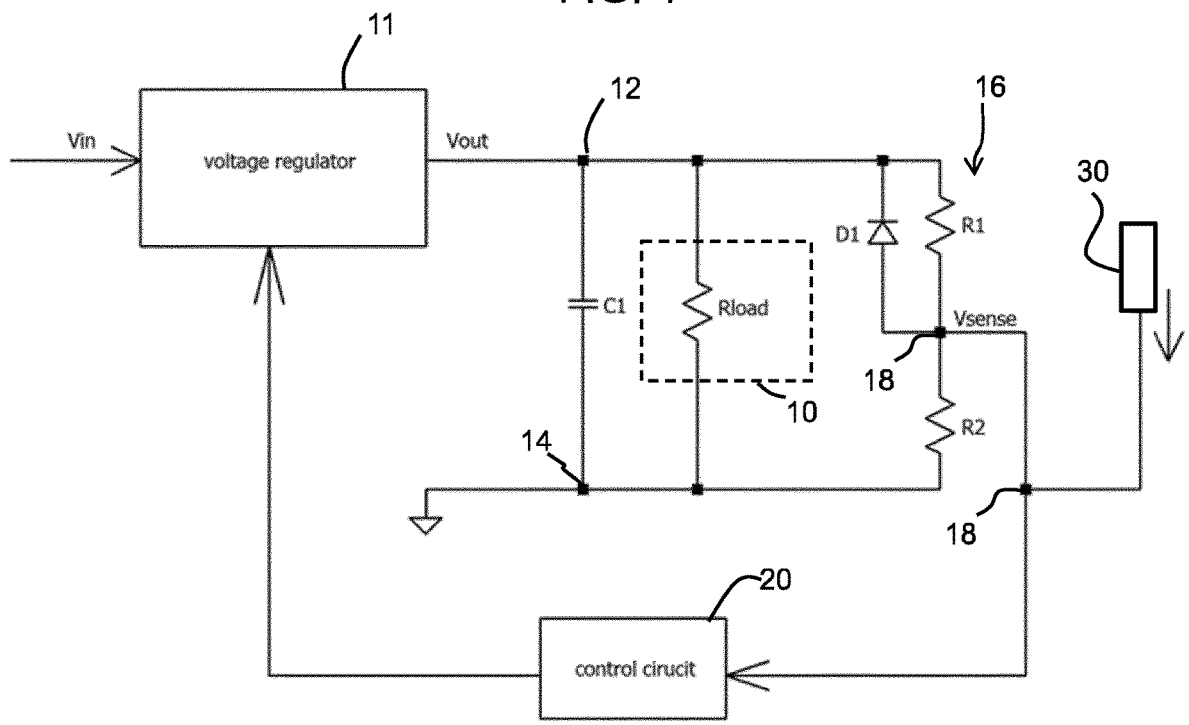
FIG. 2 shows an electronic appliance using a modified voltage sensing circuit in accordance with an example of the invention.

FIG. 2 shows an electronic appliance using a modified voltage sensing circuit in accordance with the invention.

The same components as in FIG. 1 are given the same reference numerals and a description is not repeated.

A first modification is that a current injector 30 is provided for injecting current to the sensing terminal 18. A second modification is that a voltage clamping component D1 is forwarded from the sensing terminal 18 to the first terminal 12. In particular, the voltage clamping component is in a forward direction from the sensing terminal to the first terminal. Thus, when a current flows through the voltage clamping component in the forward direction, the sensing terminal is clamped at a fixed voltage (or at least substantially fixed voltage) above the voltage at the first terminal.

The controller 20 is for receiving the sense signal as in the example of FIG. 1 and is additionally for controlling the current injection.

If a sense signal is detected (with no current injection) that has dropped below a minimum threshold, this indicates a short circuit fault. However, in order to determine the cause of the fault, the current injector is then controlled to inject a current into the sensing terminal 18. A further (i.e. second) sense signal is then detected in response to the injection of current. It can then be determined if the fault is caused by the circuit component or by the voltage divider.

FIG. 3 is used to show the possible circuit failure modes.

Figure 3A:
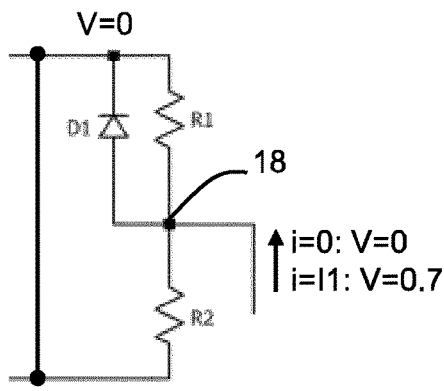
FIGS. 3A-F are used to show various possible circuit failure modes.

FIG. 3A shows a short circuit of the circuit component. In this case, the output voltage is pulled down to zero.

With no injected current, the first sense signal is V=0. The ends of the voltage divider are both at 0V and the sensing terminal is thus at V=0. In practical implementation, a voltage less than 50 mV can be regarded as V=0 fault.

If a current I1 is injected to the sensing terminal 18, the current will flow to ground through each of resistors R1 and R2 as well as the diode D1 (which are in parallel to ground), raising the voltage at the sensing terminal. However, The resistance of resistors of voltage divider is usually very large. As a result the voltage at the sensing terminal is clamped by the diode D1 so it settles at the clamping voltage, such as a diode forward voltage of 0.7V. A diode, or Zener diode, or transistor, or any other clamping component may be used. Multiple detections of such voltage can be done to ensure a correct detection.

Figure 3B:
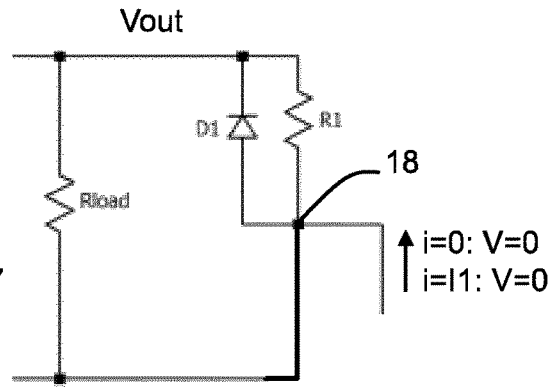

FIG. 3B shows a short circuit of the second resistor R2, which is the resistor across which a voltage is measured. In this case, the voltage at the sensing terminal is pulled down to zero. Again, a voltage less than 50 mV can be regarded as the short circuit of R2. Multiple detections of such voltage can be done to ensure a correct detection.

With no injected current, the first sense signal is V=0.

If a current I1 is injected to the sensing terminal 18, the current is shorted to ground and the voltage remains at V=0.

Figure 3C:
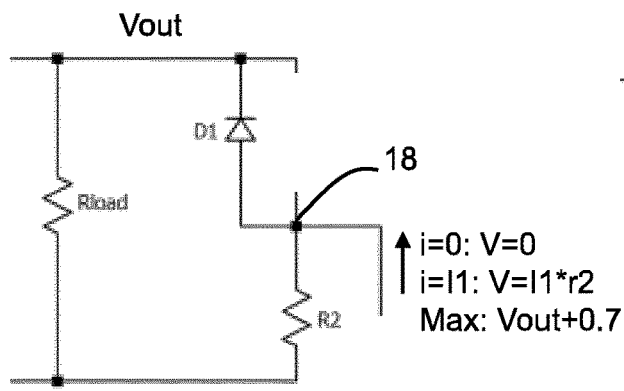

FIG. 3C shows an open circuit of the first resistor R1.

With no injected current, the first sense signal is V=0 because the sensing terminal is coupled to ground with no resistor current (and hence no voltage drop).

If a current I1 is injected to the sensing terminal 18, the current creates a voltage drop across the resistor R2. Depending on the current level, this voltage may be selected to be higher than a voltage encountered during normal operation of the circuit. If the current is sufficient to reach the threshold voltage of the voltage clamping component, the voltage will be V=Vout+0.7 or I1×r2 (where r2 is the resistance of the resistor R2). In both cases, the voltage is higher than 0V. In a more specific implementation, I1×r2 is selected as much higher than the clamping voltage 0.7V of the diode D1, such as 5V, to make a clear differentiation from 0.7V. For example, I1 is 0.7 mA and r2 is largen than 7.2K Ohm. Multiple detections of such voltage can be done to ensure a correct detection.

It can be seen that when the sensed voltage of the first sense signal is below a first threshold (e.g. at V=0), a second measurement using an injected current enables discrimination between a shorted circuit component, an open circuit of R1 and a short circuit of R2.

By detecting the cause of the circuit failure before the current regulation, unsafe circuit operation can be prevented.

The sensing is performed at a faster rate than the speed of the feedback control loop to ensure that the output voltage or current do not become too high while the fault is in the process of being detected.

There are three further circuit conditions shown in FIGS. 3D to 3F, which do not cause the first sense signal to drop below the lower threshold.

Figure 3D:
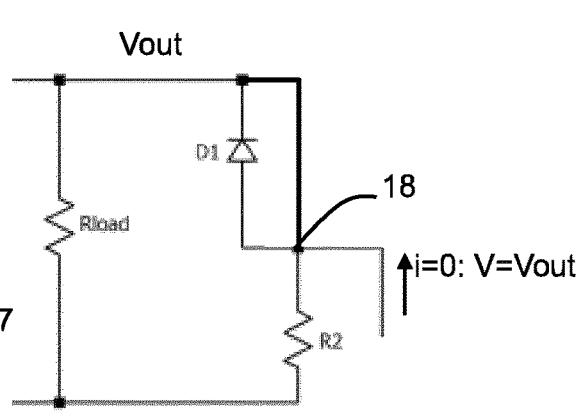

FIG. 3D shows a short circuit of the first resistor R1. In this case, the voltage at the sensing terminal is pulled high to Vout.

With no injected current, the first sense signal is V=Vout and hence higher than the fraction of Vout which result during normal operation. From this higher sense signal, the fault can be identified. This does not cause a safety issue, because the feedback control will reduce the output.

Thus, this fault condition does not require a further sensing measurement with current injection.

Figure 3E:
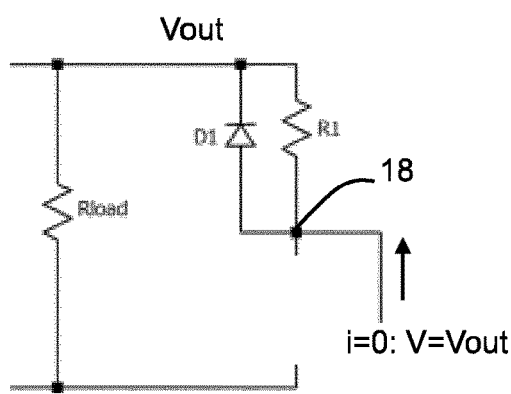

FIG. 3E shows an open circuit of the second resistor R2. In this case, the voltage at the sensing terminal is pulled high by resistor R1.

With no injected current, the first sense signal is V=Vout. From this higher sense signal, the fault can be identified. Again, this does not cause a safety issue, because the feedback control will reduce the output.

Thus, this fault condition does not require a further sensing measurement with current injection.

It can be seen that if the voltage rises to the level of the output voltage Vout, the resistor divider is responsible for the fault.

Figure 3F:
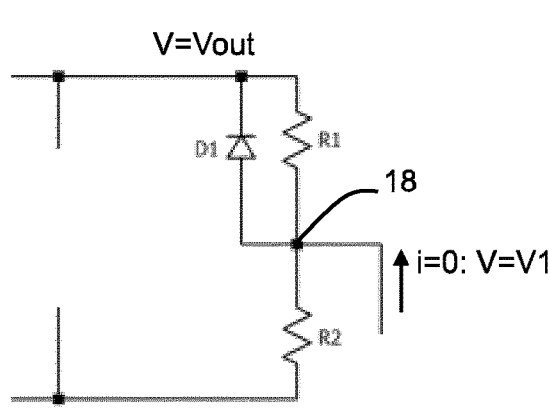

FIG. 3F shows an open circuit failure of the circuit component.

With no injected current, the first sense signal is V=V1, which is a divided voltage derived from the output voltage. With no current being drawn by the load, the current delivered by the driver (if it is a current source) will all flow through the voltage divider, resulting in a large increase in voltage Vout and hence large increase in voltage Vsense=V1 at the sensing terminal.

The output will thus be regulated (by reducing the output current) to bring V1 down.

Thus, this fault condition does not require a further sensing measurement.

This open circuit load condition may be detected for example because the duty cycle of the regulated output voltage drops below a minimum. Thus, it is possible from the single sense signal to determine whether the voltage divider or the circuit component is responsible for the circuit failure, out of the failure modes shown in FIGS. 3D to 3F.

The system can thus distinguish between all six conditions shown in FIG. 3 in that they each give a different first sense signal or a different combination of sense signals with and without an injected current.

The fault detection described above is based on the assumption that one fault happens at a time.

If it is determined that there is a short circuit in the circuit component (the load), the driver 11 may still be controlled in a short circuit protection mode during which the driver may deliver a minimum current (using a current control loop, not shown) which is selected such that it will not harm the system as a whole. This may be used to enable a fast restart when the fault is removed. If the feedback loop (i.e. the voltage divider) fails, the driver may instead be completely shut down to avoid overload or shut down for a relatively long time such as longer than 200 ms and restart again.

Figure 4:
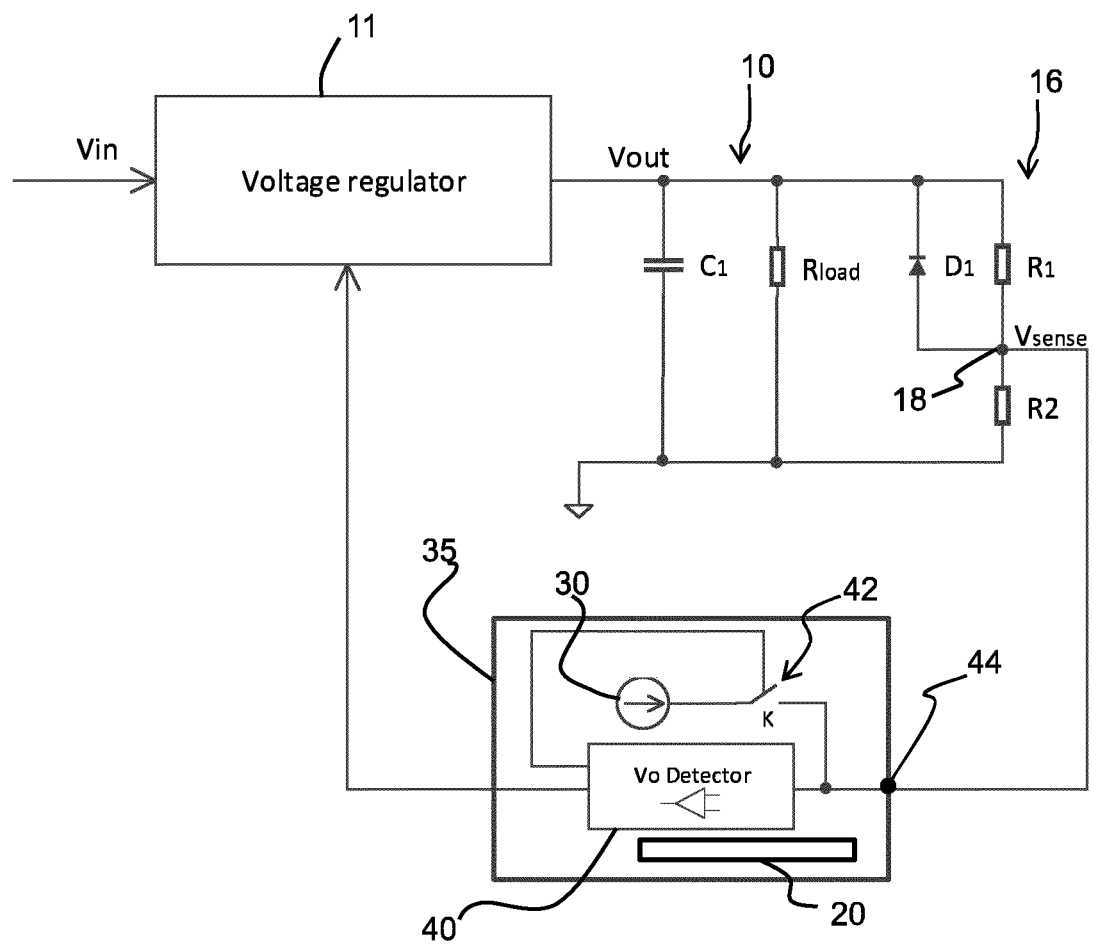
FIG. 4 shows an implementation of the voltage sensing circuit of FIG. 2.

FIG. 4 shows an implementation of the voltage sensing circuit of FIG. 2, in which the controller 20 comprises a voltage detector 40 (for determining the first and second sense signal voltages at the sensing terminal) and the current injector 30 in the form of a current source. The voltage detector may be a comparator or amplifier.

In a first implementation, the voltage detector 40 compares the sense signal with a low threshold, to detect if the sense signal is zero (or close to zero). It then controls a switch 42 to implement the delivery of current to the sensing terminal 18 to allow a second sense signal to be measured.

In a further modification, the voltage detector may also compare the sense signal with a high threshold, to detect if the sense signal is above a normal operating voltage to detect the failure modes of FIGS. 3D and 3E.

The voltage detector 40, the current injector 30 and the controller 20 may together form, or form part of, an integrated circuit 35. The integrated circuit 35 has a sensing input 44 for connection to the sensing terminal 18 of the voltage divider 16.

The invention may be applied to any control system which employs voltage sensing in order to provide feedback control.

A LED driver may for example make use of a switch mode power converter.

For example, the driver then has a switching stage (such as a two-transistor inverter stage) and the switching duty cycle and/or frequency is controlled in dependence on the feedback signal. The power converter may be a buck converter or a boost converter or a flyback converter. The invention may be applied to resonant converters or nonresonant converters. The invention may be applied to isolated or non-isolated drivers. Furthermore, the invention may be applied to linear drivers which do not employ high frequency switching.

Thus, the invention is applicable to all kinds of drivers using a resistive voltage sensing circuit.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A voltage sensing circuit for sensing a voltage across a circuit component, comprising:
    a first terminal and a second terminal adapted to connect across the circuit component;
    a voltage divider including first and second resistors in series, connected in parallel with the circuit component and between the first terminal and the second terminal, wherein a sensing terminal between the first and second resistors is for providing a sense signal that is able to indicate the voltage across the circuit component;
    a voltage clamping component coupled from the sensing terminal to the external circuit component;
    a current injector for injecting current to the sensing terminal; and
    a controller for receiving the sense signal and for controlling the current injection, wherein the controller is adapted to:
        detect if the sense signal has dropped below a minimum threshold indicating a fault and in response control the current injector to inject a current into the sensing terminal; and
        detect the sense signal in response to the injection of current and in response thereto determine if the fault is caused by the circuit component or by the voltage divider by comparing the sense signal in response to the injected current and a clamping voltage of the voltage clamping component.

2. The voltage sensing circuit as claimed in claim 1, wherein the controller is adapted to determine that the fault is caused by the external circuit component if the sense signal voltage equals to a clamping voltage of the voltage clamping component and determine that the fault the caused by the voltage divider if the sense signal is different from the clamping voltage of the voltage clamping component.

3. The voltage sensing circuit as claimed in claim 1, wherein the voltage clamping component comprises a diode forwarded from the sensing terminal to the first terminal.

4. The voltage sensing circuit as claimed in claim 3, wherein the controller is adapted to determine that the first and second terminals are short circuited due to the circuit component if the sense signal in response to the injection of current is substantially equal to a clamp voltage of the voltage clamping component.

5. The voltage sensing circuit as claimed in claim 4, wherein the controller is adapted, if it is determined that the first and second terminals are short circuited due to the circuit component, to generate a short circuit protection mode message in response to which a driver is adapted to deliver a minimum current or to generate a shut down message in response to which a driver is adapted to be shut down.

6. The voltage sensing circuit as claimed in claim 1, wherein the controller is adapted to determine that the first resistor connected to the first terminal is open if the sense signal in response to the injection of current is above an upper threshold.

7. The voltage sensing circuit as claimed in claim 6, wherein the controller is adapted, if it is determined that the first resistor is open or the second resistor is short circuited, to generate a shut down message.

8. The voltage sensing circuit as claimed in claim 1, wherein the controller is adapted to determine that the second resistor connected to the second terminal is short circuited if the sense signal in response to the injection of current is below a lower threshold, preferably equal to zero.

9. The voltage sensing circuit as claimed in claim 1, further comprising:
    a voltage detector adapted to determine the sense signal at the sensing terminal,
    wherein the voltage detector, the current injector and the controller together form a part of an integrated circuit.

10. A lighting device comprising:
    the voltage sensing circuit as claimed in claim 1; and
    a LED arrangement which comprises the circuit component.

11. The lighting device as claimed in claim 10, further comprising a voltage regulator for controlling the voltage applied to the LED arrangement.

12. The lighting device as claimed in claim 11, wherein the voltage sensing circuit is adapted, if it is determined that the first and second terminals are short circuited due to the circuit component, to send:
    a short circuit protection mode message to the voltage regulator to control the voltage regulator to allow output of a minimum current; or
    a shut down message to the voltage regulator to control the voltage regulator to completely shut down and output substantially no current.

13. An integrated circuit comprising a voltage sensing function to sense a voltage across an external circuit component, comprising
    a sensing input to be connected to a sensing terminal of a voltage divider which is connected in parallel with the external circuit component, wherein said sensing terminal is coupled to the external circuit component via a voltage clamping component;
    a voltage detector adapted to determine a sense signal voltage at the sensing input;
    a current injector to inject current to the sensing terminal if the sense signal voltage is below a minimum threshold, thereby indicating a fault, wherein the voltage detector is then adapted to determine a sense signal voltage at the sensing input in response to the injected current from the current source; and
    a controller to determine if the fault is caused by the voltage divider or by an external circuit component connected in parallel with the voltage divider, based on the sense signal voltage in response to the injection of current by comparing the sense signal in response to the injected current and a clamping voltage of the voltage clamping component.

14. A voltage sensing method for sensing a voltage relating to a circuit component between a first terminal and a second terminal, the method, comprising:
- receiving a first sense signal from a sensing terminal between first and second resistors in series that forms a voltage divider, the first sense signal indicating a voltage across a circuit component being sensed, wherein there is a voltage clamping component coupled from the sensing terminal to the circuit component;
- detecting if the first sense signal has dropped below a minimum threshold and in response controlling a current injector to inject a current into the sensing terminal;
- detecting a second sense signal in response to the injection of current; and
- determining if the fault is caused by the circuit component or by the voltage divider based on the second sense signal, by comparing of the second sense signal in response to the injected current and a clamping voltage of the voltage clamping component.

15. The voltage sensing method as claimed in claim 14, wherein the controller is adapted to determine that the fault is caused by the external circuit component if the second sense signal voltage equals to a clamping voltage of the voltage clamping component and determine that the fault the caused by the voltage divider if the second sense signal is different from the clamping voltage of the voltage clamping component, wherein the voltage clamping component is a diode forward from the sensing terminal to the first terminal, wherein the method comprises:

- determining that the first and second terminals are short circuited due to the circuit component if the second sense signal is substantially equal to a clamp voltage of the voltage clamping component; and/or
- determining that the first resistor connected to the first terminal is open if the second sense signal is above a higher threshold; and/or
- determining that the second resistor connected to the second terminal is short circuited if the second sense signal is below a lower threshold, preferably zero.

* * * * *